United States Patent
Hess et al.

(10) Patent No.: US 9,219,455 B2
(45) Date of Patent: Dec. 22, 2015

(54) PEAK DETECTION WHEN ADAPTING A SIGNAL GAIN BASED ON SIGNAL LOUDNESS

(71) Applicant: Harman Becker Automotive Systems GmbH, Karlsbad (DE)

(72) Inventors: Wolfgang Hess, Karlsbad (DE); Frank Baehren, Pforzheim (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 373 days.

(21) Appl. No.: 13/757,304

(22) Filed: Feb. 1, 2013

(65) Prior Publication Data
US 2013/0195279 A1 Aug. 1, 2013

(30) Foreign Application Priority Data
Feb. 1, 2012 (EP) .................................... 12153458

(51) Int. Cl.
| | |
|---|---|
| H03G 3/00 | (2006.01) |
| H03G 3/30 | (2006.01) |
| H03G 5/00 | (2006.01) |
| H03G 5/16 | (2006.01) |
| H03G 9/00 | (2006.01) |
| H03G 9/02 | (2006.01) |

(52) U.S. Cl.
CPC .............. *H03G 3/00* (2013.01); *H03G 3/3089* (2013.01); *H03G 5/005* (2013.01); *H03G 5/165* (2013.01); *H03G 9/005* (2013.01); *H03G 9/025* (2013.01)

(58) Field of Classification Search
USPC ......... 381/56, 58, 59, 98, 101–104, 106, 107; 700/94
See application file for complete search history.

(56) References Cited

U.S. PATENT DOCUMENTS

| | | | |
|---|---|---|---|
| 5,706,357 A | * | 1/1998 | Yang .............................. 381/107 |
| 7,386,133 B2 | | 6/2008 | Hess et al. |
| 8,879,750 B2 | * | 11/2014 | Walsh et al. .................. 381/103 |
| 2005/0147262 A1 | * | 7/2005 | Breebaart ..................... 381/106 |
| 2010/0198377 A1 | | 8/2010 | Seefeldt et al. |
| 2010/0320819 A1 | * | 12/2010 | Cohen et al. ............... 297/217.4 |

(Continued)

OTHER PUBLICATIONS

Lindemann, "Extension of a Binaural Cross-Correlation Model by Contralateral Inhibition I. Simulation of Lateralization for Stationary Signals", Journal of Acoustic Society of America, Dec. 1986, p. 1608-1622, vol. 80 (6).

(Continued)

*Primary Examiner* — Vivian Chin
*Assistant Examiner* — Friedrich W Fahnert
(74) *Attorney, Agent, or Firm* — O'Shea Getz P.C.

(57) ABSTRACT

Various embodiments relate to a system for adapting a signal gain, which comprises a peak detector configured to receive an audio input signal containing consecutive signal blocks and to dynamically establish a current input signal level of the audio input signal, and a loudness determination unit configured to dynamically determine a perceived loudness of a current signal block of the audio input signal based on a psycho-acoustic model of a human hearing. Furthermore the system comprises a time constant generation unit configured to determine a time constant based on the perceived loudness of the current signal block and the perceived loudness of a preceding signal block, wherein the time constant describing a change of the signal gain. A gain determination unit is configured to determine the signal gain for the current signal block based on the time constant and the current input signal level.

13 Claims, 8 Drawing Sheets

(56) References Cited

U.S. PATENT DOCUMENTS

2011/0009987 A1    1/2011    Seefeldt et al.
2011/0228953 A1    9/2011    Hess
2012/0163629 A1    6/2012    Seefeldt

OTHER PUBLICATIONS

Hess et al., Acoustical Evaluation of Virtual Rooms by Means of Binaural Activity Patterns, Audio Engineering Society Convention Paper, 115th Convention, Oct. 2003.

* cited by examiner

PEAK DETECTION WHEN ADAPTING A SIGNAL GAIN BASED ON SIGNAL LOUDNESS

1. CLAIM OF PRIORITY

This patent application claims priority from EP Application No. 12 153 458.0 filed Feb. 1, 2012, which is hereby incorporated by reference.

2. FIELD OF TECHNOLOGY

The present invention relates to the field of audio signal processing, and in particular to a method for adapting a signal gain and to a system for adapting a signal gain based upon signal loudness.

3. RELATED ART

Many different sources of audio signals containing music and/or speech are known. For example, audio signals can be stored on a CD, a DVD, or on any other storage medium. Especially with the development of new compression schemes, such as MPEG, audio signals with different genres and artists are stored on a storage medium and may be combined to a create playlist to be played out to a user.

In a vehicle environment, the audio signals perceived by the passengers contain the audio signal itself and road tire noise, aerodynamics noise, and engine noise. The different audio signals of the different audio sources often have different signal and dynamics compression levels. Often, different tracks of an audio signal have different signal level ranges which are perceived by the user with a different loudness level. It is even possible that one track of an audio signal covers a wide signal level range, e.g., as may be the case in classical music.

Especially in a vehicle environment the received audio signal should always be perceivable to the user, meaning that it should exceed the noise present in the vehicle preferably at all times. When parts of the audio output signal level fall below the noise level, they become too silent. However, a static increase of the average audio output level may result in a strongly increased maximum signal level. At the same time, the maximum audio signal level should not exceed a certain level where hearing damage could occur or where the perception is painful or distractive for the user.

Methods are known which dynamically adapt a gain of an audio output signal based on the perceived loudness. However, if the loudness varies on a short time scale, those methods do not provide the necessary adaptability to follow the fast changes in loudness.

There is a need for a dynamic and automatic correction of a loudness level in audio signals in a vehicle.

SUMMARY OF THE INVENTION

According to a first aspect, a method of adapting a signal gain is provided. The method comprises receiving an audio input signal containing consecutive signal blocks and establishing a current input signal level of the audio input signal. The method further comprises determining a perceived loudness of a current signal block of the audio input signal based on a psycho-acoustic model of human hearing using a signal level range within the current signal block of the audio input signal. The method further comprises determining the signal gain of the current signal block based on a time constant and the current input signal level, wherein the time constant describes a change of the signal gain from a signal block to another signal block and wherein the time constant is determined based on the perceived loudness of the current signal block and the perceived loudness of a preceding signal block. The method further comprises amplifying the audio input signal with the determined signal gain to obtain an audio output signal.

By determining the signal gain based on a time constant, as well as on the current input signal level, it may be possible to determine the signal gain in view of the output signal level. The output signal level may be predicted from the input signal level and the signal gain.

Each signal block may contain a predefined number of digital samples, e.g., 64, 256, or 1024 digital samples. A digital sample may relate to a digital value which determines a current signal level. In other words: the current signal level may refer to a signal level of a smallest information piece defining the audio input signal. Yet, in general it is possible that a few of these digital samples are combined for the establishing of the current input signal, for example 5 or 10 or 30 digital samples or the digital samples of a signal block. By determining the perceived loudness for signal blocks, it may be possible to obtain a good estimate of the perceived loudness as well as to detect pauses, etc., where predominantly signal noise is present. This is because when determining the perceived loudness, a number of digital samples may enter the determination. In other words, the calculation of the digital loudness may rely on the signal range and properties of a number of digital samples, i.e., rely on some averaged statistics. For example, when determining the loudness, 256 digital samples may be considered in one signal block. Then, fast changes or short peaks of the signal level may not have a strong influence on the perceived loudness.

It should be understood that the loudness may be determined for signal blocks containing a different number of digital samples than the signal blocks for which the time constants are determined. For example, the loudness may be determined for blocks containing 256 samples while time constants may be determined for blocks containing 1024 samples. For example, an average or a weighted average of the loudness for these four smaller blocks (256 samples) may be used to determine the time constant for the respective larger block (1024 samples). This may introduce latency into the system when determining the time constants.

Determining the signal gain for the current signal block based on a time constant and based on the current input signal level may relate to determining the signal gain for the current signal block using the time constant as an input and using the current input signal level as an additional input. In other words, the parameters which influence determining the signal gain directly may be the time constant and the current input signal level.

Then, for example, the signal gain may be determined such that an output signal level of the audio output signal is always smaller than a predefined threshold. The predefined threshold may be defined in order to meet requirements imposed by digital processing of the audio signal. In detail, digitally processing an audio signal may impose limitations with respect to the maximum, achievable signal level. Typically, a digital headroom may be provisioned in order to meet the requirement that the signal level of the audio output signal does not exceed 0 dB full scale (0 dBFS), dB full scale meaning decibels relative to the maximum amplitude that can be represented by the system. Also, a predefined threshold may be defined in order not to exceed a maximum acoustic pressure selected by a user or set in order to avoid hearing damage or distraction.

The method according to the aspect may further comprise determining the time constants.

In particular, a rising time constant may be used in order to obtain an increased signal gain between two consecutive signal blocks of the audio output signal and a falling time constant may be used to obtain a decreased signal gain between two consecutive signal blocks of the audio output signal. By using rising and falling time constants, it may become possible to adapt the signal gain from signal block to signal block such that an average loudness of the audio output signal is achieved.

The signal gain may be determined in such a way that an average output signal level of the audio output signal averaged over a number of signal blocks equals a predefined value. This may correspond to an average loudness of the audio output signal which equals a predefined value of the predefined loudness. For example, the audio input signal may contain passages which have a small loudness value and other passages which have a large loudness value, i.e., the audio input signal may have a large dynamic range of signal levels. In an environment such as a vehicle there may exist a large background signal such as noise from the environment. If there is a large noise level, it may be difficult for a user to perceive passages of the audio signal which have a low loudness. Therefore, by using rising and falling time constants in order to adapt the signal gain such that a predefined loudness of the audio output signal is achieved, the audio output signal may be better suited for playback in an environment with background noise.

For example, the predefined value and/or the predefined loudness may be specified by a user according to his needs. Also it may be possible to adapt the degree to which the signal gain is determined based on the time constants. It may also be possible to determine the predefined value automatically depending on various parameters such as the background signal level, this means the noise level, a vehicle type, a driving speed of the vehicle, presence or absence of navigation instructions or the like, etc. An average output signal level and therefore an average loudness may be achieved by determining the time constants such that if the signal level of a current signal block is below the predefined value, a rising time constant is used, and respectively a falling time constant if the signal level is above the predefined value. The absolute signal gain change provided by the time constant may be larger if the deviation of the current signal level from the predefined value is larger.

It should be understood that the user may have the possibility of adjusting the overall volume level via a dedicated volume adjustment means. This volume adjustment may, e.g., amplify the audio output signal downstream in the signal processing sequence. Then determining the signal gain based on the time constant and the current input signal level may relate to adapting the dynamic range of the audio signal and adjusting the volume may relate to an overall and uniform shift in the playback volume in a post-processing step downstream in the signal processing sequence.

In particular, the time constants may be determined in such a way that a falling time constant allows a larger maximum absolute signal gain change between consecutive signal blocks in comparison to a rising time constant. By limiting the maximum absolute signal gain change between consecutive signal blocks of the audio signal as defined via rising and falling time constants, the dynamic range of the audio output signal may be preserved while still adapting the average loudness of the audio output signal accordingly. For example, during a silent part of the audio input signal, i.e., zero signal level, the signal gain may be quickly reduced in order not to amplify noise. Then it may be necessary to increase the signal gain via a rising time constant after the silent part has ended in order to amplify the audio input signal accordingly such that the user can perceive its contents. Yet if there is a quiet part of an audio track containing, e.g., music or voice at a low signal level, the signal gain may be increased via rising time constants in order to provide audibility.

A method according to the current aspect may further comprise establishing an estimated output signal level of the audio output signal based on the input signal level and the current signal gain. By determining the input signal level and the signal gain, it may be possible to establish an output signal level before amplifying the audio input signal to obtain the audio output signal.

The maximum absolute signal gain change allowable by rising or falling time constants may be increased if the estimated output signal level is above a predefined threshold. As set forth above, this may increase the flexibility in controlling the output signal level.

A method according to the current aspect may further comprise including a delay time into the audio input signal before it is output, wherein the delay time relates to the time needed to determine the signal gain. Because various calculations may be necessary in order to determine the signal gain, such as determining the perceived loudness of a current signal block of the audio input signal, establishing a current input signal level of the audio input signal, determining a time constant, and based on this, determining a signal gain, a delay may be advantageous in order to perform all these calculations via, e.g., a processor. On the other hand, it may be necessary to limit the delay because with longer delay times higher hardware requirements such as memory requirements may arise. Also for playback in connection with a video source, synchronous playback of sound and video may be essential. It may therefore be necessary to optimize the delay with respect to the two opposing trends, i.e., latency for signal analysis, as well as reducing hardware requirements.

To this respect, the perceived loudness may be determined further based on signal statistics of the audio input signal. The signal statistics may determine particular parameters of the signal level of the audio input signal, such as dynamic range, rate of signal level change, maximum signal level, minimum signal level, signal level histogram, etc., and based on these parameters determine the perceived loudness. Via signal statistics it may be possible to detect silent pauses in the audio input signal, e.g., via a certain distribution of values of digital samples.

According to a further aspect, a system for adapting a signal gain is provided. The system comprises a peak detector configured to receive an audio input signal containing consecutive signal blocks, and to dynamically establish a current input signal level of the audio input signal. Furthermore, the system comprises a loudness determination unit which is configured to dynamically determine a perceived loudness of a current signal block of the audio input signal based on a psycho-acoustic model of a human hearing using a signal level range of the current signal block of the audio input signal. The system further comprises a time constant generation unit configured to determine a time constant based on the perceived loudness of the current signal block and the perceived loudness of a preceding signal block, wherein the time constant describes a change of the signal gain from a signal block to another signal block. Furthermore, the system comprises a gain determination unit which is configured to determine the signal gain for the current signal block based on the time constant and the current input signal level. Also, the system comprises a gain unit which is configured to amplify the audio input signal using the signal gain to obtain an audio output signal.

These and other objects, features and advantages of the present invention will become apparent in light of the detailed description of the embodiments thereof, as illustrated in the accompanying drawings. In the figures, like reference numerals designate corresponding parts.

DESCRIPTION OF THE DRAWINGS

The invention will be described in further detail with reference to the accompanying drawings.

FIG. 1b schematically illustrates a peak detector being part of the system of FIG. 1a;

FIG. 2 schematically illustrates a more detailed view of the system for adapting a signal gain of FIG. 1a;

DETAILED DESCRIPTION OF THE INVENTION

In the following, the invention will be explained in further detail by referring to exemplary embodiments and to the accompanying drawings. The illustrated embodiments relate to techniques for adapting a signal gain.

Figure 1A:
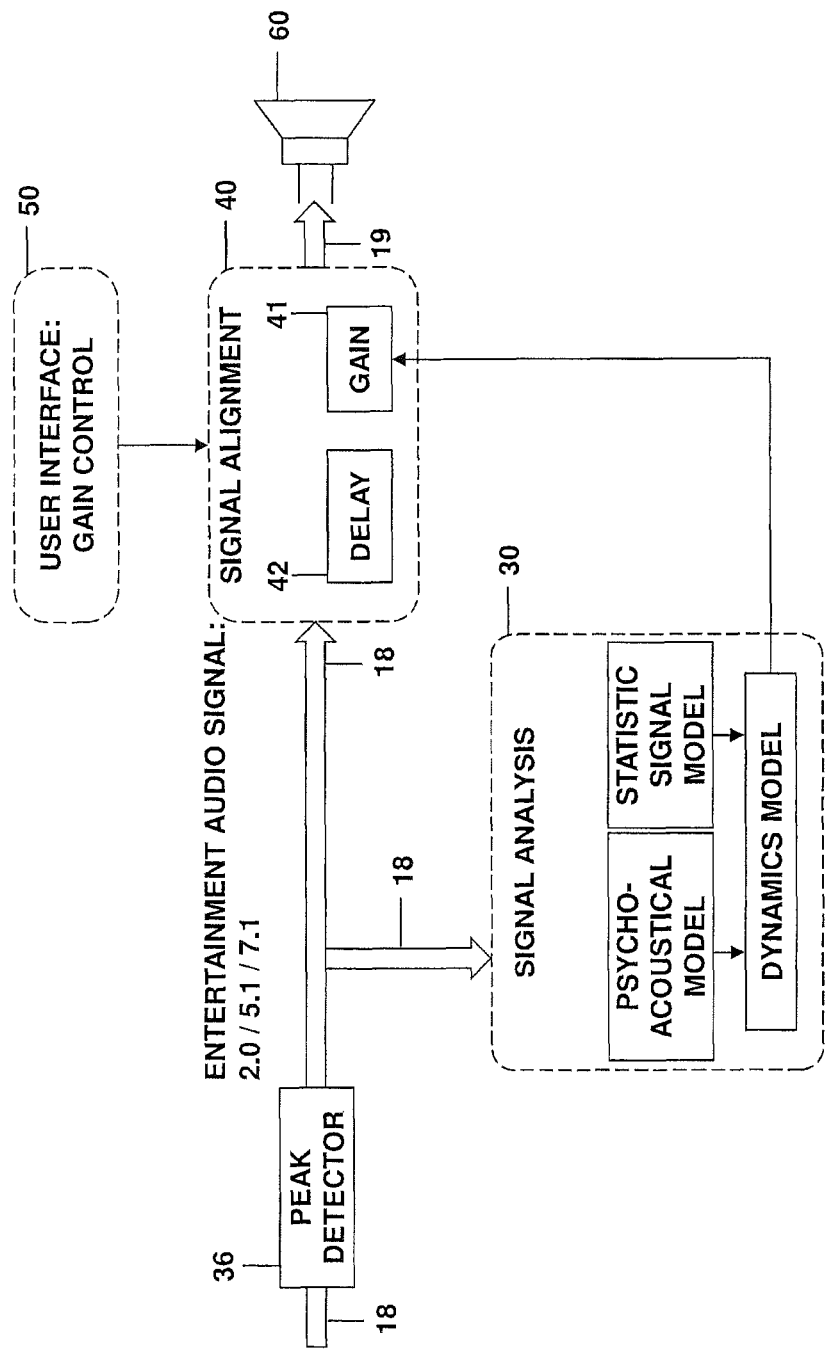
FIG. 1a schematically illustrates a system for adapting a signal gain according to an embodiment.

In FIG. 1a, a system is shown which allows for adapting the signal gain. An audio input signal 18 obtained from an audio source enters a peak detector 36. The entertainment or audio input signal 18 can be, for example, a 2.0, 5.1, or 7.1 audio signal or another format. The peak detector analyzes the audio input signal 18 to establish a current input signal level of the audio input signal 18. From the peak detector 36, the audio input signal is forwarded to an audio signal analyzing unit 30 in which the loudness is determined using a psycho-acoustical model of the human hearing and using signal statistics.

The audio input signal 18 is also input into a signal controller 40 comprising a gain unit 41 and a delay element 42. The gain applied by the gain unit 41 to the audio input signal to obtain an audio output signal 19 can be controlled using a user interface 50, where it can be determined whether or to which extent the gain determined by a gain determination unit, not shown in FIG. 1a, is used for the audio output signal 19. For example, this can correspond to the possibility for the user to switch on/switch off the loudness based signal gain determination. The audio output signal is output via a loudspeaker 60 or fed to a post-processing stage, e.g., uniform amplification based on a volume setting (not shown).

Figure 1B:
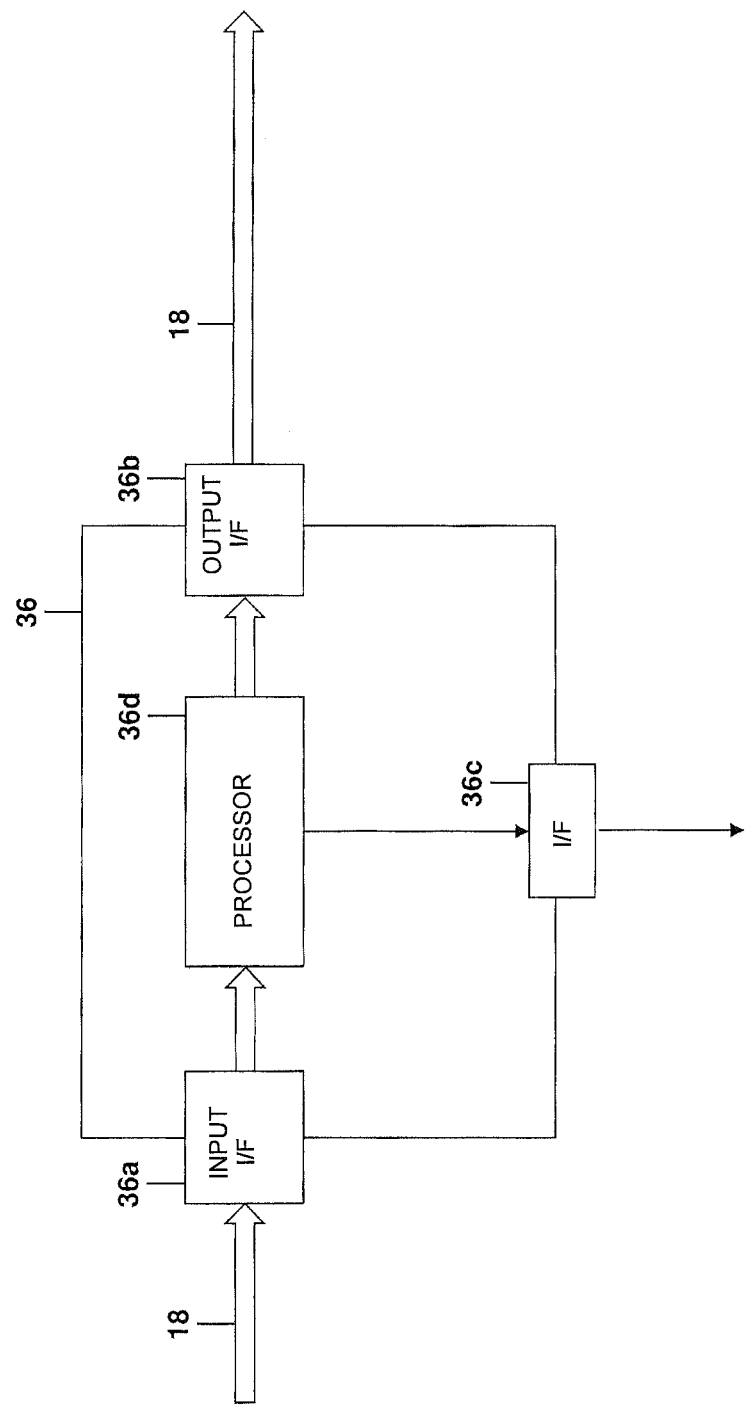

In FIG. 1b, a more detailed view of the peak detector 36 is given. The peak detector 36 comprises a processor 36d and a receiving interface 36a for receiving the audio input signal 18. The peak detector 36 further comprises an output interface 36b for outputting the audio input signal 18. Furthermore, the peak detector 36 comprises an interface 36c. The processor 36d is adapted to establish a current input level of the audio input signal 18. For example, the current input level may relate to the signal level of a current digital sample or may relate to a maximum signal level of a current signal block that includes a number of digital samples. This audio input signal 18 is output via the interface 36c.

Referring again to FIG. 1, in the signal analyzing unit 30 it is indicated that the loudness is determined based on a psycho-acoustical model of the human hearing. The psycho-acoustical model is used to estimate the loudness, localization of sound, and to determine whether noise is present in the audio input signal as a dominant factor, e.g., during a pause or between two tracks. The signal statistics is the second basis for determining whether a pause with noise is present in the audio signal. By way of example, the signal strength of the entertainment audio signal can be determined. Based on the psycho-acoustical model alone or in combination with the statistical signal model, a loudness adaptation is determined by dynamically determining adaptive time constants as will be described in further detail below with respect to FIG. 2.

Even though the different entities of FIG. 1a have been discussed separately, it should be understood that different entities may be combined in one unit. Different entities may be implemented as hardware or software or a combination thereof. For example, the peak detector 36 may be part of the signal controller 40 or the signal analyzing unit 30. Then the interface 36c of FIG. 1b may be an internal interface or may be implemented as software code, only.

Figure 2:
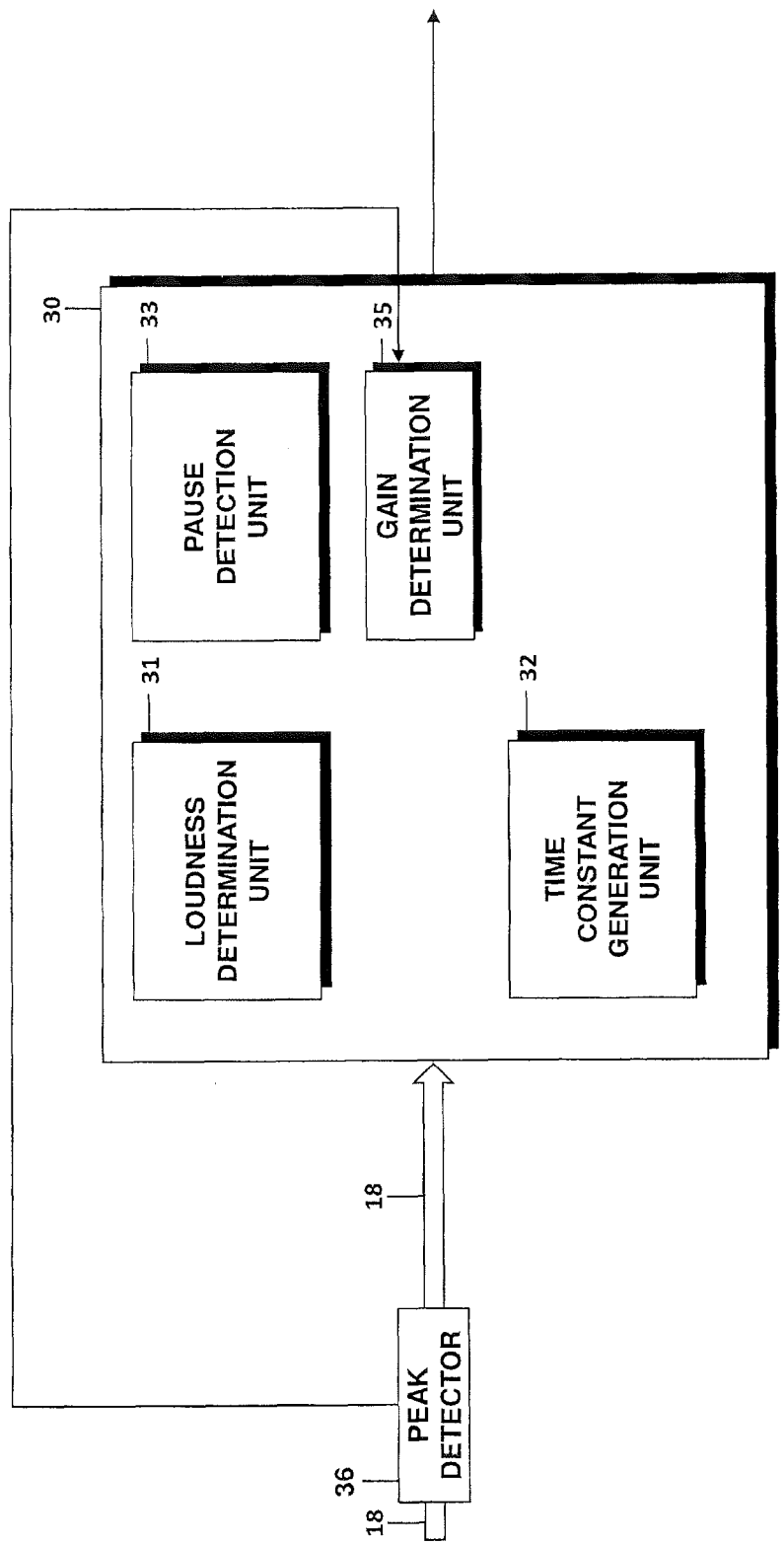

In FIG. 2, a more detailed view of the audio signal analyzing unit 30 is shown. The audio signal analyzing unit 30 comprises a loudness determination unit 31 estimating a loudness of the received audio input signal. The loudness determination unit 31 may determine the loudness with methods known in the art and as described for example inter alia in ITU-R BS 1770-1 ("Algorithms to Measure Audio Program Loudness and to a Peak Audio Level"). The loudness determination unit 31 may furthermore use a binaural model of the human hearing for determining the loudness and for determining whether and where the audio input signal 18 may be localized by a user when hearing the audio input signal.

This binaural model simulates the spatial perception of the audio input signal and allows to determine whether the audio input signal contains mainly noise or any other input signal such as music or speech. The localization of the audio input signal is described in more detail in U.S. Pat. No. 7,386,133 incorporated herein by reference, in the document W. Lindemann "*Extension of a Binaural Cross-Correlation Model by Contralateral Inhibition I. Simulation of Lateralization for Stationary Signals*" in Journal of Acoustic Society of America, December 1986, p. 1608-1622, Vol. 80(6), or in the document "*Acoustical Evaluation of Virtual Rooms by Means of Binaural Activity Patterns*" by W. Hess et. al. in Audio Engineering Society Convention Paper, 115$^{th}$ Convention, October 2003. This localization technique allows to discriminate noise from other sound signals and helps to avoid that when only noise is detected in the audio input signal this noise is output with an increased signal gain. It also allows to reset the adaptive time constants when a pause is detected.

In particular, when determining the loudness, it may be necessary to analyze or process signal levels of the audio input signal 18 within a certain period of time, i.e., for a certain number of digital samples. Therefore, the perceived loudness is determined for signal blocks of the audio input signal. Each signal block has a specific duration, i.e., contains a specific number of signal samples. In one embodiment, a signal block may have a duration of 1 or 2 milliseconds or contain, e.g., 256 samples. By determining the loudness for each audio signal block, latency is introduced into the system.

Furthermore, the loudness determination unit 31 may also use statistical signal processing in order to detect signal pauses, i.e., signal blocks where only noise is present. This can occur as part of a pause detection unit 33. In the statistical analysis of the audio input signal 18 the actual signal level of different samples of the audio input signal is determined. By way of example, if the signal level of samples of a signal block of the audio input signal 18 follow a Gaussian distribution, it may be deduced that the signal block contains noise and no other audio signal. This illustrates in further detail the necessity to determine the loudness for a number of digital samples, i.e., a signal block, where a statistic may be obtained. Very short peaks etc. are not overly emphasized.

The audio signal analyzing unit 30 then uses the result of the loudness estimation for calculating time constants that are introduced into the audio input signal. In FIG. 2, the calculation of the time constants is symbolized by the time constant generation unit 32. A time constant specifies the change of the signal gain from signal block to signal block or from a group of respective signal blocks to a group of respective signal blocks. In other words, the number of digital samples grouped into a signal block can differ for the determination of the loudness (e.g., being 256) and for the calculation of the time constant (e.g., being 1024). In any case, due to the formation of signal blocks, latency is introduced into the system. The time constant generation unit 32 is coupled to the gain determination unit 35.

In the embodiment of FIG. 2, the loudness determination unit 31, the time constant generator 32, the pause detection unit 33, and the gain determination unit 35 are shown as separate units. However, it should be clear to one skilled in the art that the different units may be incorporated into fewer units and that the units may be combined in several units or even in one unit. Furthermore, the signal analyzing unit may be designed by hardware elements or by software or by a combination of hardware and software.

The gain determination unit 35 determines the signal gain used to amplify the audio input signal 18 based on the time constants. The loudness determination unit 31 provides a loudness for a certain part of the audio input signal, e.g., a signal block containing several samples, by providing a dB loudness equivalent (dBLEQ). The gain is determined such that a predefined loudness is achieved when outputting the audio signal, e.g., −12 dB as shown in the lower part of FIG. 6. Here loudness is specified relative to a reference loudness, e.g., the loudness of a 1 kHz sinusoidal signal under the specific reference settings. This can define the dBLEQ scale.

The time constants are configured such that the maximum absolute signal gain change from signal block to signal block is limited. This is done in order to increase the audio quality as perceived by a user. For example, fast signal dynamics, e.g., fast beats etc., may be preserved while comparably long passages of low loudness are amplified using a higher signal gain. In other words, the fast dynamics are preserved, while the loudness based signal gain adaptation targets at the slow signal dynamics. Due to the restricted maximum absolute signal gain change, the time constants introduce further latency into the system.

Therefore, the determining of the time constants is a first source of latency while the signal gain adaptation through the time constants being limited to a maximum absolute change is a second source of latency. In general, it may be desired to have a larger latency in order to increase the accuracy in determining the loudness and the accuracy of the time constants. On the other hand, hardware requirements may impose limitations on maximum acceptable latency, e.g., due to limited memory.

Furthermore, due to such latency, a situation may occur where, e.g., within a signal block or within two consecutive signal blocks, there is an immediate rise of the signal level within a few digital samples. Because of the latency of the determined loudness and/or the latency of the adaptation of the time constants, this may result in a situation where the signal gain is not sufficiently quickly reduced such that the output signal level is above a maximum level, i.e., a predefined threshold. The maximum level may be due to hardware reasons where the digital full scale is reached, i.e., 0 dBFS is reached. Then audio clipping can occur which results in an undesired degradation of the audio playback quality as perceived by a user.

In order to avoid the output signal level becoming larger than 0 dBFS when fast changes of the input signal level occur from very silent to very loud, it is possible to provide an enhanced digital headroom. However, the digital headroom leads to an attenuated overall output signal level and therefore has to be compensated during the signal processing. This is necessary to meet system requirements with respect to the maximum sound pressure level. Such a compensation for extended digital headroom typically requires tuning of the system at different stages of signal processing which can be complex and time consuming.

To this respect, in an embodiment, the gain determination unit 35 is configured to determine the gain not solely based on the time constants, but also based on the input signal level obtained from the peak detector 36. By predicting an output signal level based on the input signal level and the time constants, it is possible to adapt the signal gain such that the signal level of the audio output signal remains below the predefined threshold and/or remains below 0 dBFS.

Figure 3:
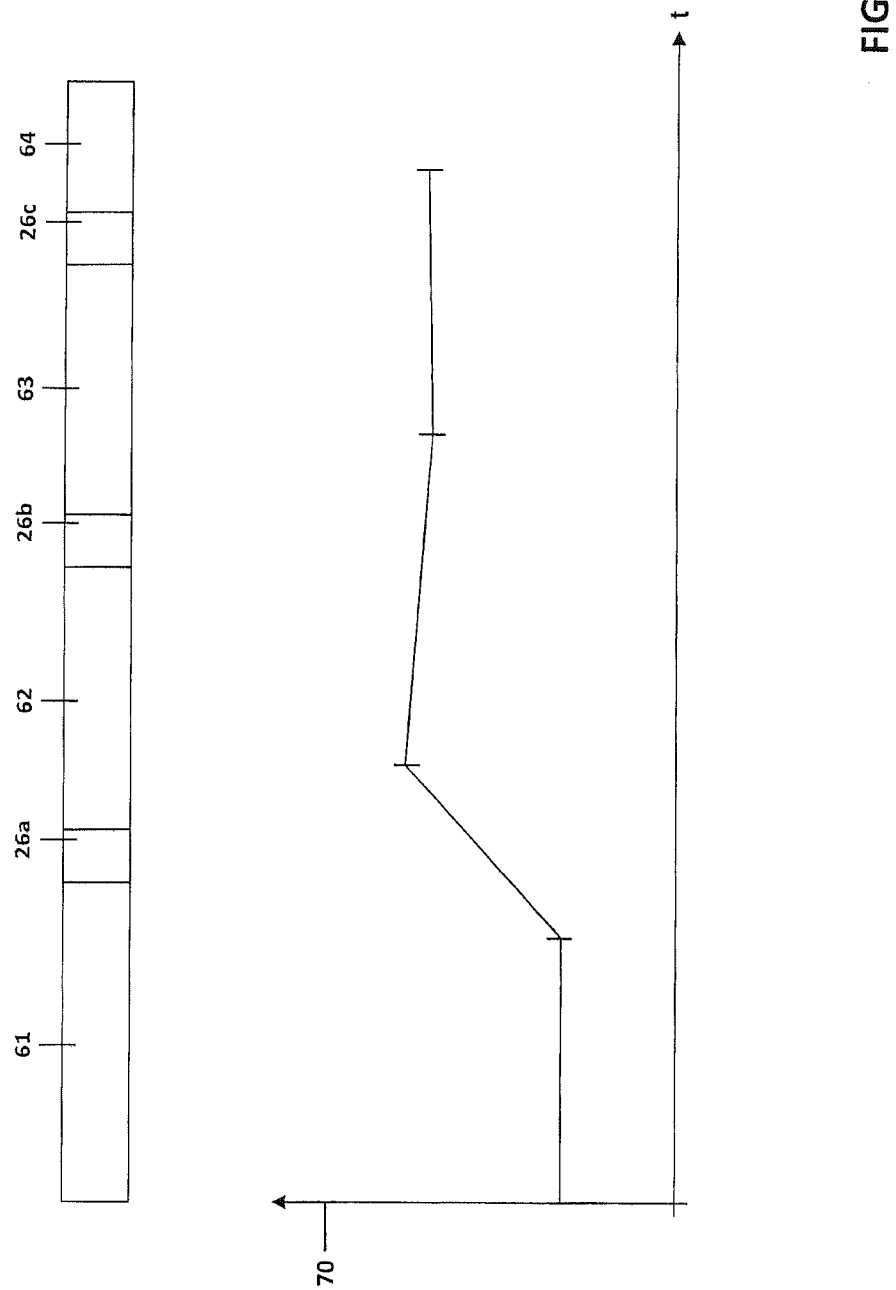
FIG. 3 schematically illustrates time constants used for a method of adapting a signal gain.

In FIG. 3, the time constants are illustrated further. Different blocks 61, 62, 63, 64 of the audio input signal are shown separated by the time constants 26a, 26b, 26c. The time constants 26a, 26b, 26c indicate how the loudness should be adapted from one sample to the next sample via an adaptation of the signal gain 70. A time constant can be a rising time constant 26a or a falling time constant 26b or a constant time constant 26c. The rising time 26a constant indicates how the signal gain is increased from one sample to the next sample, whereas the falling time constant 26b indicates the gain decrease from one sample to the next sample. The constant time constant 26c leaves the gain 70 unchanged. This is illustrated in FIG. 3, lower part. Based on the loudness adaptation using the time constants, a gain for each block is determined by, e.g., the gain determination unit of FIG. 2. The gain for a specific block may then be obtained in a linear ramp starting from the gain of the previous block. Different gain changes are possible.

The loudness may be determined originally for smaller blocks than the blocks 61-64 depicted in FIG. 3, i.e., blocks containing fewer digital samples. Forming an average may yield a loudness for the blocks 61-64 of FIG. 3.

The time constants 26 are determined in one embodiment in such a way that a rising time constant can increase the gain much more rapidly than a falling time constant can decrease the gain, i.e., the maximum absolute signal gain change allowable by a rising time constant is larger than the maximum absolute signal gain change allowable by a falling time constant. By way of example, if a signal pause is determined between two tracks or within a track, the output audio signal level should not be increased in order to avoid the amplification of noise, i.e., a small signal gain should be applied to the audio input signal. When a new track starts, high signal levels may occur directly after very low signal levels. The rising time constants of the loudness estimation may have to be adapted quickly in order to avoid that the output signal level at the beginning of a new track is too small. The falling time constant may only allow for a slower decrease of the signal level compared to the increase.

Yet, in another embodiment the time constants 26 are determined in such a way that falling time constant can decrease the gain much more rapidly than a rising time constant can increase the gain. This can be desired when amplification of noise at the end of a track or in a pause is to be avoided.

Furthermore, the time constants are adaptive time constants meaning that the reaction time associated with the time constants decreases with advancing playback time of a track, i.e., the latency of the gain adaptation is increased for larger playback times within a track. In other words, a time constant will strongly adapt the gain in the beginning of a track, while towards the end of the track the adaptation strength decreases. This can be valid for the increasing and decreasing time constants. A smoothed loudness estimation guarantees also a loudness estimation in a way like humans perceive loudness. Rapid peaks and dips are smoothed out by the human auditory system. If a pause in a track or between two tracks is determined, the adaptive time constants may be reset. The pause detection carried out in the signal analyzing unit 30 is symbolized by the pause detection unit 33 in preceding FIG. 2.

Figure 4:
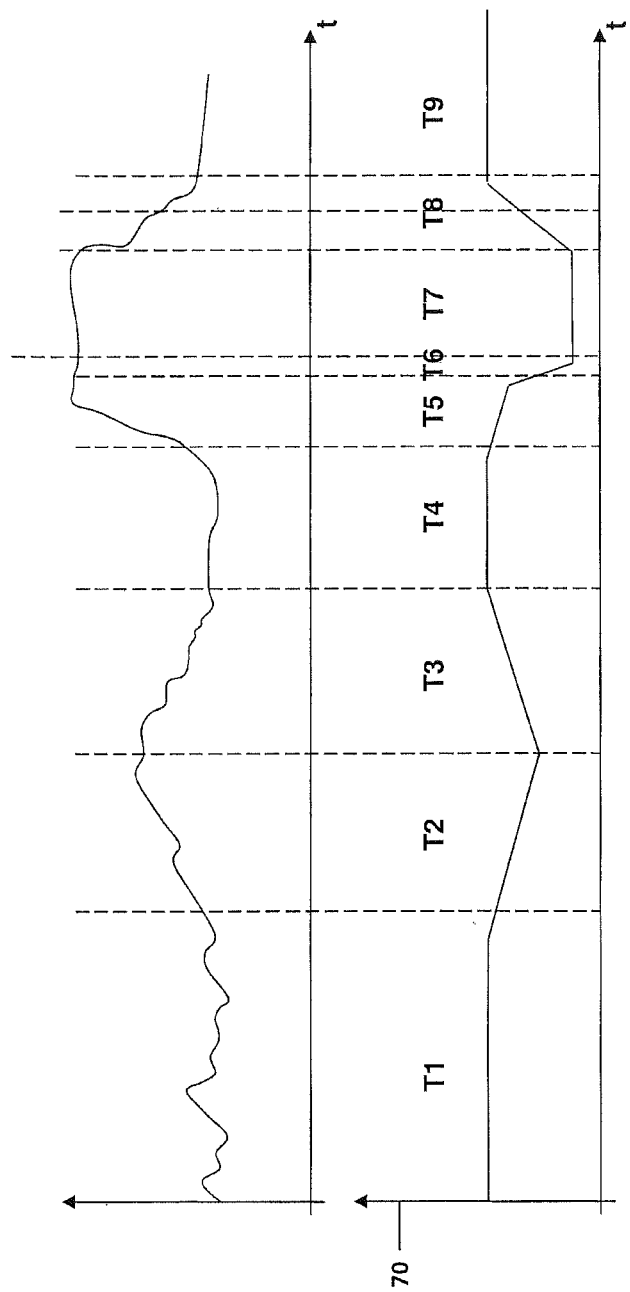
FIG. 4 illustrates schematically the adapting of a signal gain based on the determined signal level and loudness.

In FIG. 4, the adaptation of the gain in the gain determination unit 35 is further illustrated. In the upper part of FIG. 4, the estimated loudness as a function of the time is depicted for an audio input signal, e.g., a music track. The different blocks of the track are not depicted. Based on the estimated loudness, the gain 70 is adapted which is depicted in the lower part of FIG. 4. For example, the estimated loudness within the time interval labeled T1 remains approximately constant. Only fast changes of the loudness are present which are not considered for the adaptations of the gain 70 due to the latency introduced by the time constants as discussed previously with respect to FIG. 3.

Then, in the time interval labeled T2, a steady increase of the loudness occurs. As a consequence, the gain is accordingly decreased. This is realized by falling time constants as discussed before. A respective situation occurs in the time interval labeled T3, where the loudness is steadily decreasing which results in a steady increase of the gain 70. This is realized by increasing time constants.

In the time interval labeled T4, a similar situation as discussed with respect to time interval T1 is present. Then, in time interval T5, a rapid increase of the loudness occurs. The gain 70 is accordingly decreased via falling time constants. However, the maximum change of the gain 70 is limited by the maximum allowable rate of change of the falling time constants. At the end of time interval T5, this results in a situation where the audio input signal is amplified with a gain such that the signal level of the audio output signal comes close to a predefined threshold.

In order to avoid that the output signal level reaches the predefined threshold, in time interval T6, the gain 70 is rapidly decreased. This occurs in the gain determination unit 35, see FIG. 2, due to the input obtained from the peak detector 36. Based on the audio input signal level and based on the time constants obtained from the time constant generation unit 32, it is possible to predict or establish in the gain determination unit 35, e.g., via a processor, that the output signal level determined solely based on time constants would be above the predefined threshold. This establishing can occur without actually amplifying the audio input signal to obtain the audio output signal.

In other words, the latency of the system due to use of time constants and loudness determination for signal blocks is overridden by the peak detection indicating that a signal gain is too high. By this it becomes possible to maintain the output signal level below a predefined threshold.

The time interval T7 corresponds to the time intervals T1 and T4 where no adaptation of the gain is performed. Likewise, in time interval T9 no adaptation of the gain occurs. In time interval T8, a steady increase of the gain 70 via rising time constants is performed due to a decrease in the estimated loudness.

As can be seen from FIG. 4, it is possible to maintain a specific latency in the gain adaptation using the time constants preserving the fast dynamics while, at the same time, avoiding that the output signal level becomes larger than a predefined threshold.

Figure 5:
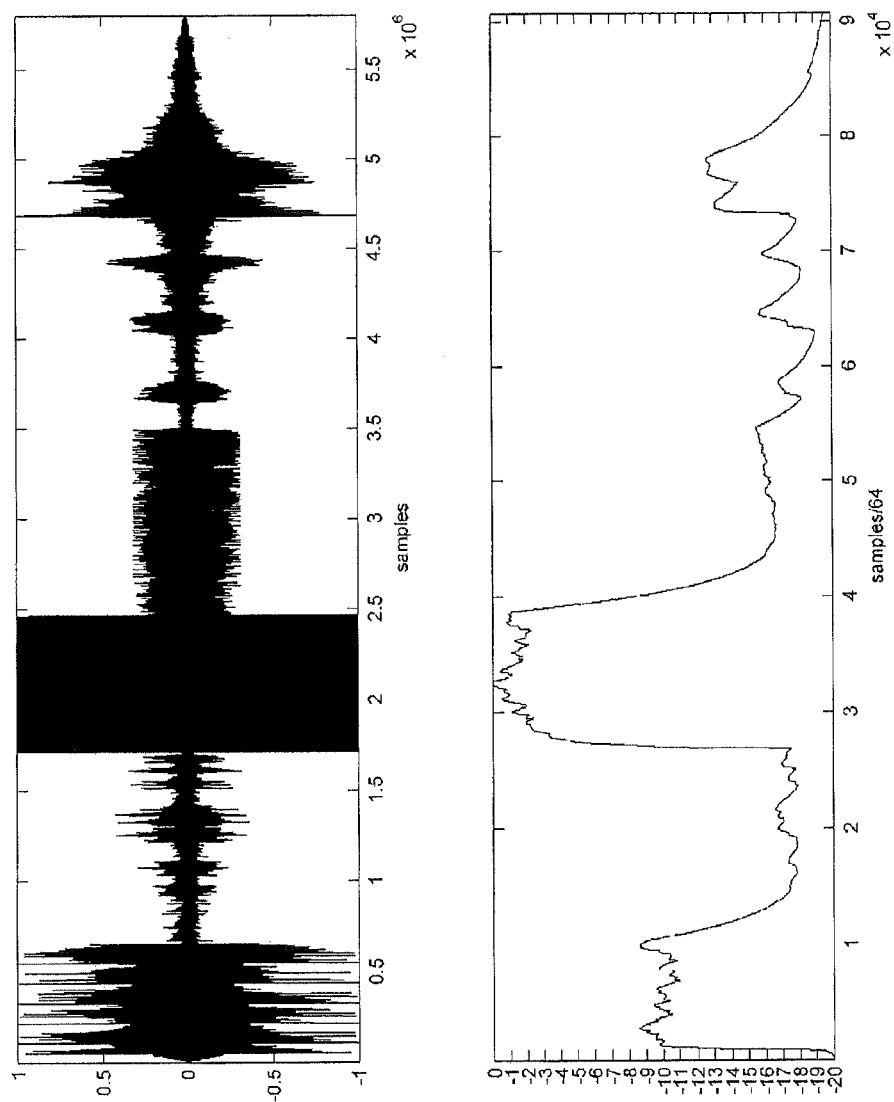
FIG. 5 schematically shows the components of an in-vehicle sound.
Figure 6:
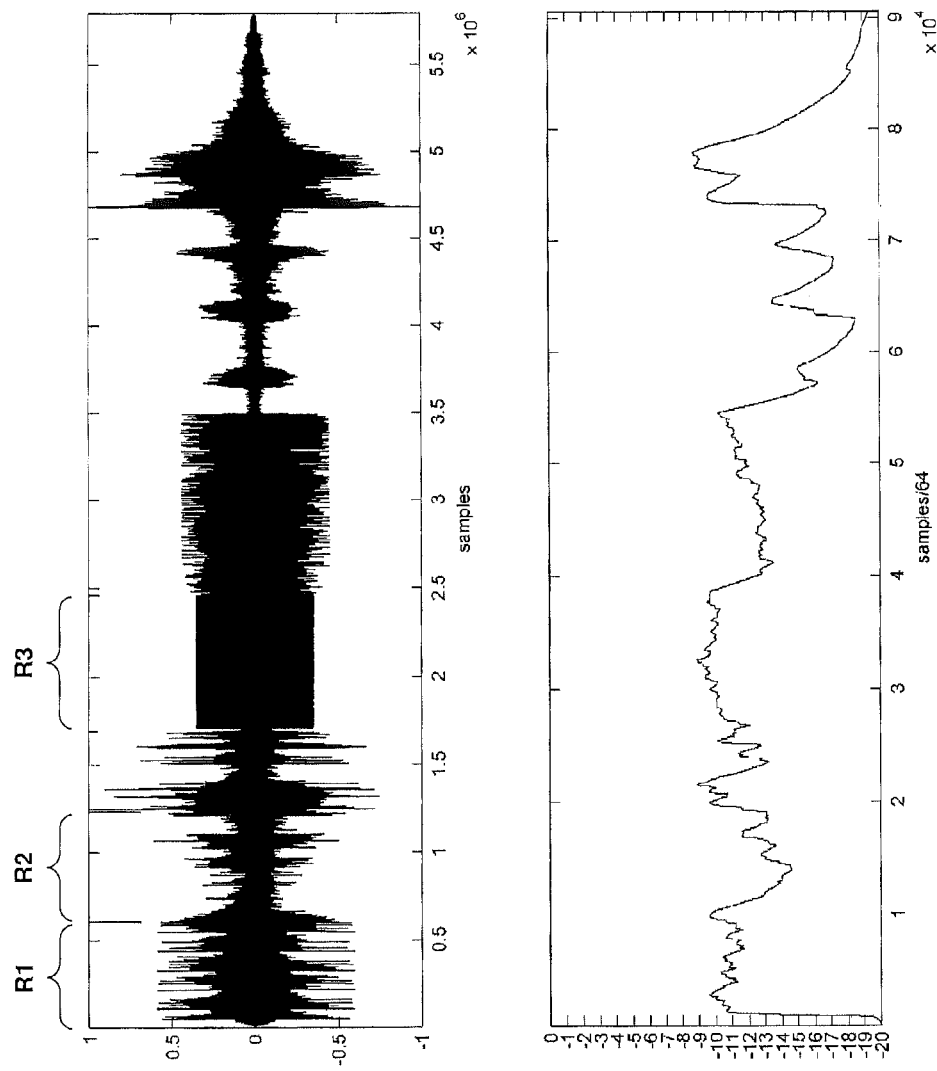
FIG. 6 schematically shows the components of an in-vehicle sound with adapted signal gain.

In the upper part of FIG. 5, a signal level of an audio input signal is shown in full scale, meaning that 0 dBFS is assigned to the maximum possible signal level in the digital domain. As can be seen from the upper part of FIG. 5, the signal level, and therefore also the loudness level corresponding to the signal as perceived by a user, varies considerably. In the lower part of FIG. 5, the corresponding loudness is estimated from the signal input level. In the present application, loudness may be estimated through a binaural localization model. In FIG. 6 an adjusted level of the signal of FIG. 5 is shown. By way of example, the signal samples in range R1 are adapted to a lower signal level, whereas the signals in range R2 are adapted to a higher signal level for a good perception by the user. Similarly, the signals in range R3 are output with a strongly decreased signal level.

In the lower part of FIG. 6 the corresponding estimated loudness of the adjusted level in the upper part is shown. When the lower part of FIG. 5 is compared to the lower part of FIG. 6, it can be deduced that a loudness evaluation as shown in FIG. 6 may be better suited for playback in a situation with background noise in comparison to the loudness evaluation as shown in FIG. 5. The loudness evaluation of FIG. 6 can be perceived better than the loudness evaluation of FIG. 5. A smoothed, relatively constant loudness is reached and visualized here. In particular, an averaged loudness level of −12 dB is obtained. Also, in range R3 it is avoided to have signal output levels above a threshold.

Figure 7:
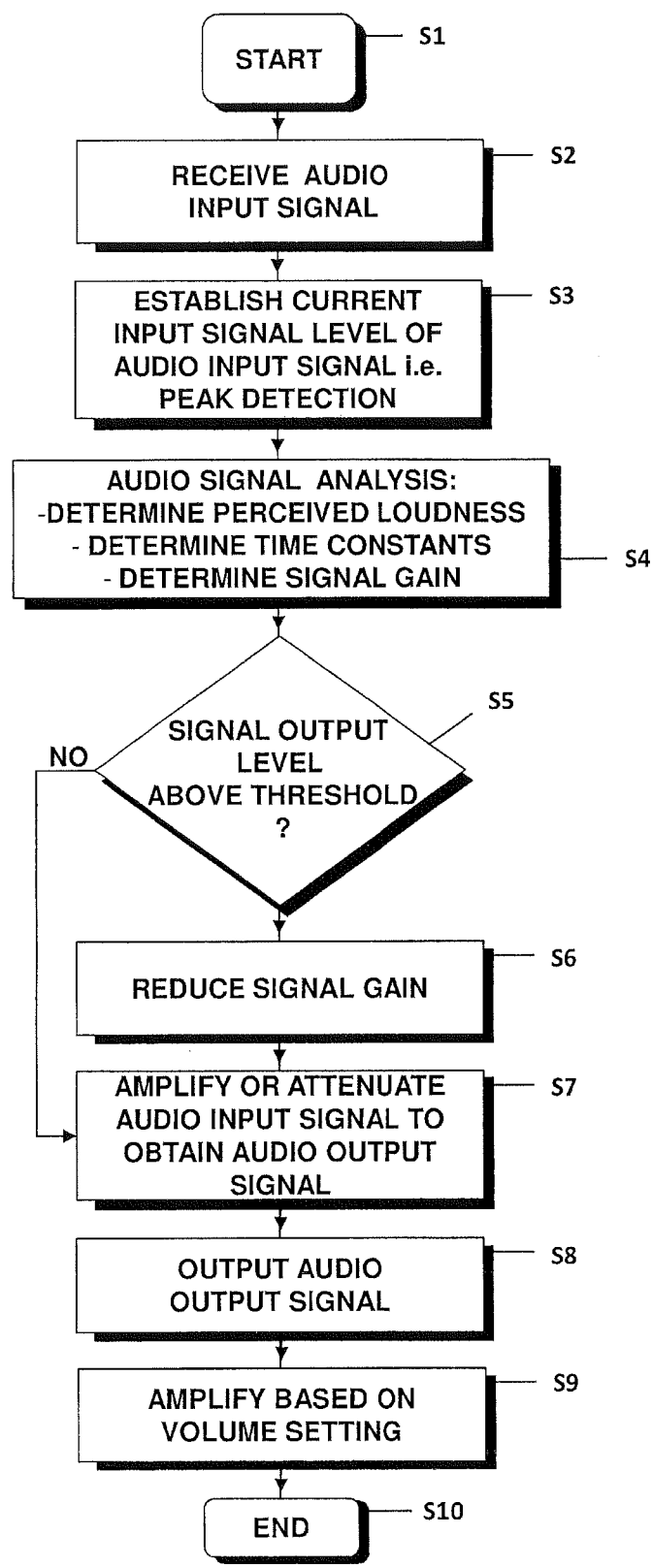
FIG. 7 is a flowchart of a method of adapting a signal gain.

In FIG. 7, a flowchart illustrating a method according to an embodiment is illustrated. The method starts in step S1. In step S2, an audio input signal is received. The audio signal can, e.g., be an entertainment audio signal obtained from an audio source such as a CD, DVD, radio, hard drive, or the like.

Next, in step S3, the current input signal level of the audio input signal is established. This is referred to as peak detection. The input signal level may be determined for a single digital sample or for a signal block containing a number of digital samples.

Then, in step S4, the entertainment audio signal analysis occurs, e.g., in a signal analyzing unit. This comprises determining of a loudness of the audio input signal. The loudness is determined for signal blocks of the audio input signal. This corresponds to a determination of the loudness using latency. Based on the determined loudness, time constants are determined in step S4 which specify the adaptation of the signal gain from signal block to signal block. In particular, the time constants are determined such that the rate of change of the signal gain from block to block does not exceed a maximum absolute signal gain change. This corresponds to an adjustment of the loudness using latency.

Also, in step S4, based on the determined time constants, a signal gain is determined, e.g., in a gain determination unit. The signal gain is also determined based on the current input signal level which has been established as part of the peak detection in step S3. Based on the current input signal level and the signal gain, it is possible to predict the signal output level. This is indicated in step S5, where it is checked if the signal output level determined, e.g., via time constants is above a predefined threshold. If the signal output level is above the threshold, in step S6, the signal gain is adapted to maintain the signal output level below the predefined threshold in step S6. For this, an estimated output signal level of the audio output signal may be established based on the input signal level and the signal gain.

Then, in step S7, the audio input signal is amplified or attenuated using the determined signal gain in, e.g., a gain unit. In step S8, the audio output signal is output towards, e.g., a loudspeaker or for further post-processing. Typically, the further post-processing can comprise step S9, e.g., the amplification of the audio output signal based on a volume setting of the user. The method terminates in step S10.

While specific embodiments of the invention are disclosed herein, various changes and modifications can be made without departing from the scope of the invention. The present embodiments are to be considered in all respect as illustrative and non-restrictive, and all changes coming within the meaning and equivalency range of the appended claims are intended to be embraced therein.

Although the present invention has been illustrated and described with respect to several preferred embodiments thereof, various changes, omissions and additions to the form and detail thereof, may be made therein, without departing from the spirit and scope of the invention.

What is claimed is:

1. A method of adapting a signal gain, the method comprising:
   receiving an audio input signal containing consecutive signal blocks;
   establishing a current input signal level of the audio input signal;
   determining a perceived loudness of a current signal block of the audio input signal based on a psycho-acoustic model of a human hearing using a signal level range of the current signal block of the audio input signal;
   determining the signal gain for the current signal block based on a time constant and based on the current input signal level, the time constant describing a change of the signal gain from a signal block to another signal block, wherein the time constant is determined based on the perceived loudness of the current signal block and the perceived loudness of a preceding signal block; and
   amplifying the audio input signal with the determined signal gain to obtain an audio output signal.

2. The method according to claim 1, wherein the signal gain is determined such that an output signal level of the audio output signal is always smaller than a predefined threshold.

3. The method according to claim 1, further comprising determining the time constants.

4. The method according to claim 3, wherein a rising time constant is used to obtain an increased signal gain between two consecutive signal blocks of the audio output signal and a falling time constant is used to obtain a decreased signal gain between two consecutive signal blocks of the audio output signal.

5. The method according to claim 4, wherein the signal gain is determined in such a way that an average output signal level of the audio output signal averaged over a number of signal blocks equals a predefined value.

6. The method according to claim 4, wherein the signal gain is determined in such a way that an average loudness of the audio output signal averaged over a number of signal blocks equals a predefined value.

7. The method according to claim 1, wherein the time constants are determined in such a way that a falling time constant allows a larger maximum absolute signal gain change between consecutive signal blocks than a rising time constant.

8. The method according to claim 3, further comprising establishing an estimated output signal level of the audio output signal based on the current input signal level and the signal gain.

9. The method according to claim 8, wherein the maximum absolute signal gain change allowable by rising or falling time constants is increased if the estimated output signal level is above a predefined threshold.

10. The method according to claim 3, further comprising including a delay time into the audio input signal before it is output, wherein the delay time relates to the time needed to determine the signal gain.

11. The method according to claim 10, wherein each signal block contains a predefined number of digital samples.

12. The method according to claim 3, wherein the perceived loudness is determined further based on signal statistics of the audio input signal.

13. A system for adapting a signal gain, comprising:
    a peak detector configured to receive an audio input signal containing consecutive signal blocks, and to dynamically establish a current input signal level of the audio input signal;
    a loudness determination unit configured to dynamically determine a perceived loudness of a current signal block of the audio input signal based on a psycho-acoustic model of a human hearing using a signal level range of the current signal block of the audio input signal;
    a time constant generation unit configured to determine a time constant based on the perceived loudness of the current signal block and the perceived loudness of a preceding signal block, the time constant describing a change of the signal gain from a signal block to another signal block;
    a gain determination unit, configured to determine the signal gain for the current signal block based on the time constant and based on the current input signal level; and
    a gain unit, configured to amplify the audio input signal using the signal gain to obtain an audio output signal.

* * * * *